United States Patent
Ge et al.

(10) Patent No.: US 9,793,322 B2
(45) Date of Patent: Oct. 17, 2017

(54) APPARATUS HAVING FIRST AND SECOND SWITCHING MATERIALS

(71) Applicant: Hewlett-Packard Development Company, L.P., Houston, TX (US)

(72) Inventors: Ning Ge, Palo Alto, CA (US); Jianhua Yang, Palo Alto, CA (US); Stanley Williams, Palo Alto, CA (US); Kyung Min Kim, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 77 days.

(21) Appl. No.: 14/700,972

(22) Filed: Apr. 30, 2015

(65) Prior Publication Data
US 2016/0322424 A1   Nov. 3, 2016

(51) Int. Cl.
*H01L 45/00* (2006.01)
*H01L 27/24* (2006.01)

(52) U.S. Cl.
CPC .......... *H01L 27/2463* (2013.01); *H01L 45/08* (2013.01); *H01L 45/1233* (2013.01); *H01L 45/146* (2013.01); *H01L 45/1633* (2013.01)

(58) Field of Classification Search
CPC ............. H01L 27/2463; H01L 45/1226; H01L 45/1273; H01L 45/1608
See application file for complete search history.

(56) References Cited

U.S. PATENT DOCUMENTS

| 8,673,727 | B1 | 3/2014 | Liu et al. | |
|---|---|---|---|---|
| 9,224,949 | B2 * | 12/2015 | Yang | H01L 27/0688 |
| 2007/0249090 | A1 | 10/2007 | Philipp et al. | |
| 2012/0176831 | A1 * | 7/2012 | Xiao | G11C 13/0007 365/148 |
| 2013/0334485 | A1 * | 12/2013 | Yang | H01L 27/0688 257/2 |
| 2014/0061569 | A1 * | 3/2014 | Liu | H01L 45/04 257/4 |

(Continued)

FOREIGN PATENT DOCUMENTS

CN   103247755 A   8/2013

OTHER PUBLICATIONS

Han, Jin-Woo, et al., "Copper oxide resistive switching memory for e-textile," AIP Advances 1, 032162 (2011), Sep. 21, 2011, 9 pages, AIP Publishing, USA.

(Continued)

*Primary Examiner* — Cheung Lee
*Assistant Examiner* — Stephen C Smith
(74) *Attorney, Agent, or Firm* — Mannava & Kang, P.C.

(57) ABSTRACT

In an example, an apparatus includes an electrically conductive component having a first side and a second side, a first switching material formed on the first side of the electrically conductive component, and a second switching material formed on the second side of the electrically conductive component. The second switching material may include a different material than the first switching material and resistance states of each of the first switching material and the second switching material are to be modified through application of electric fields through the first switching material and the second switching material. The apparatus may also include an electrode in contact with one of the first switching material and the second switching material.

10 Claims, 4 Drawing Sheets

(56) References Cited

U.S. PATENT DOCUMENTS

2014/0151623 A1    6/2014  Jeon et al.

OTHER PUBLICATIONS

Huang, Jiaxing, et al., "Spontaneous formation of nanoparticle stripe patterns through dewetting," Nature Materials, Nov. 13, 2015, 5 pages, vol. 4, Nature Publishing Group, CA, USA. www.nature.com/naturematerials.

Kim, S., et al., Flexible Memristive Memory Array on Plastic Substrates, Oct. 25, 2011, Nano Letters, 2011, 11(12), pp. 5438-5442.

* cited by examiner

APPARATUS HAVING FIRST AND SECOND SWITCHING MATERIALS

BACKGROUND

Memristors are devices that can be programmed to different resistive states by applying a programming energy, for example, a voltage or current pulse. The programming energy generates a combination of electric field thermal effects, and potentially other effects that are to modulate the conductivity of both non-volatile switch and non-linear select functions in a switching element. After programming, the state of the memristor remains stable over a specified time period and the state is thus readable. Memristor elements can be used in a variety of applications, including non-volatile solid state memory, programmable logic, signal processing, control systems, pattern recognition, and other applications.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
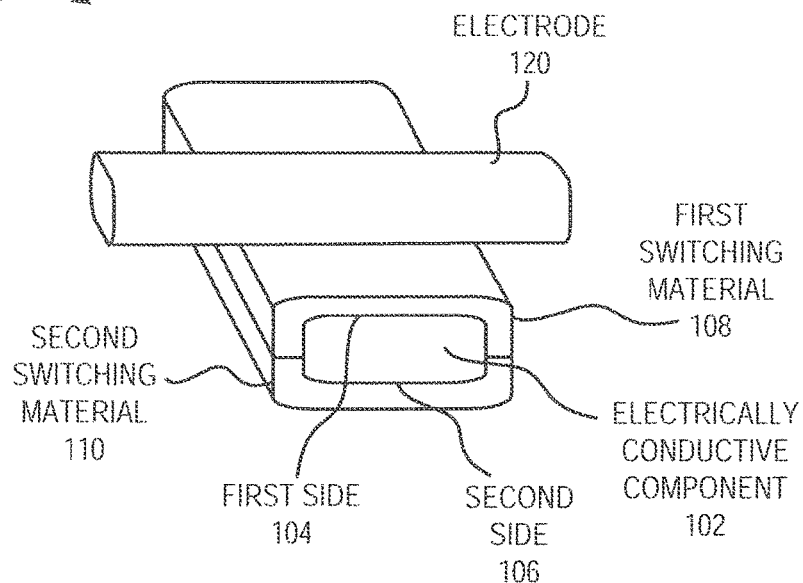
FIGS. 1 and 2A-2C, respectively, show simplified isometric views of a portion of an apparatus, according to multiple examples of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Disclosed herein is an apparatus that includes an electrically conductive component with a first switching material formed on a first side and a second switching material formed on a second side of the electrically conductive component. The apparatus may also include an electrode that is in contact with one of the first switching material and the second switching material. The first switching material and the second switching material may have different characteristics with respect to each other and thus, application of an electric field through the first switching material may have a different result as compared to application of an electric field through the second switching material. For instance, the first switching material may have a higher current threshold for switching as compared to the second switching material.

The apparatus disclosed herein may be formed of a plurality of electrically conductive components and a plurality of electrodes arranged in a crossbar configuration. Particularly, the electrodes may be positioned with respect to the electrically conductive components such that each of the electrodes alternatingly contacts the first switching material and the second switching material of a number of the electrically conductive components. In other words, the electrodes may be interweaved or interlaced with the electrically conductive components.

In another example, the apparatus disclosed herein may be formed of electrically conductive components formed of sub-components that extend collinearly with each other and are in contact with each other. The sub-components may be formed of different materials with respect to each other. In this example, an electrode may have a switching material formed thereon and the switching material may alternatingly contact a first sub-component and second sub-component on adjacent electrically conductive components. Because the first and the second sub-components may be formed of different materials, properties of switches formed at the alternating junctions between the sub-components and the electrode may differ from each other. The electrodes may also be interweaved or interlaced with the electrically conductive components in this example.

Generally speaking, the interweaved configuration of the electrically conductive components and the electrodes may afford a higher level of strength in the apparatus as compared to merely arranging the electrically conductive components on top of the electrodes. In addition, the apparatus may be supported on a flexible substrate such that the apparatus may be flexed or bent. The apparatus disclosed herein, therefore, may be employed in applications in which flexibility of the apparatus may be desirable, such as, in e-textiles, wearable electronics, etc. Moreover, because the junctions at which the electrodes contact the electrically conductive components may have alternating first and second properties, switches formed at the adjacent junctions may differ from each other. For instance, the switches formed at the adjacent junctions may have opposite polarities from each other. In one regard, therefore, sneak path leakage may be relatively lower as compared to crossbar arrays of electrodes having homogeneous adjacent junctions.

With reference to FIGS. 1 and 2A-2C, there are shown simplified isometric views of a portion of an apparatus 100, according to multiple examples. It should be understood that the apparatus 100 depicted in FIGS. 1 and 2-2C may include additional components and that some of the components described herein may be removed and/or modified without departing from a scope of the apparatus 100. In addition, although the components of the apparatus 100 have been depicted as having certain shapes and sizes, it should be clearly understood that the depictions of the components are for purposes of illustration only and that the components of the apparatus 100 may therefore have other shapes and sizes without departing from a scope of the apparatus 100.

As shown in FIG. 1, the apparatus 100 may include an electrically conductive component 102 and an electrode 120. The electrode 120 may be positioned in a crossed relationship with respect to the electrically conductive component 102. The electrically conductive component 102 and the electrode 120 may be formed of a metal or a metallic material that is to conduct electricity. In addition, the electrically conductive component 102 and the electrode 120 may be formed of different materials. As described in greater detail herein below, the electrode 120 may be positioned with a plurality of the electrically conductive component 102 such that the electrode 120 alternatively contacts the tops and the bottoms of the electrically conductive components 102. In other words, the electrode 120 may be interweaved, interlaced, entwined, etc., with the electrically conductive component 102, or vice versa.

Although not shown, the electrically conductive component 102 and the electrode 120 may each be an elongated structure, such as a wire, a thread, a strand, etc. In addition, the electrically conductive component 102 and the electrode 120 may each have a thickness that is in the nanometer scale. For instance, the electrically conductive component 102 may have a thickness that is less than 200 nm, and more particularly, a thickness that is less than about 50 nm. In other examples, the electrically conductive component 102 and the electrode 120 may each have a thickness in the micrometer or larger scale. The length of the electrically conductive component 102 may be substantially larger than the thickness of the electrically conductive component 102, e.g., in the micrometer or larger scale. The electrode 120 may have similar length dimensions.

As also shown in FIG. 1, the electrically conductive component 102 is depicted as having a first side 104 and a second side 106. The second side 106 is depicted as being positioned on the side opposite the first side 104 on the electrically conductive component 102. A first switching material 108, which is also referred to herein as the first layer 108, is depicted as being provided or formed on the first side 104 of the electrically conductive component 102. Additionally, a second switching material 110, which is also referred to herein as the second layer 110, is depicted as being positioned on the second side 106 of the electrically conductive component 102. Each of the first switching material 108 and the second switching material 110 include materials for which resistance states are to change responsive to the application of a sufficiently strong electric field through the switching materials. In addition, the first switching material 108 and the second switching material 110 are to retain the resistance states following removal of the electric field. In this regard, the first switching material 108 and the second switching material 110 are memristive materials.

The resistance states of the first switching material 108 and the second switching material 110 may be read through application of a reading voltage or current across the first switching material 108 and the second switching material 110. In addition, the resistance states of the first switching material 108 and the second switching material 110 may be cleared, e.g., reset, through application of rewriting voltages or currents, e.g., in a reverse polarity, to clear the resistance states of the first switching material 108 and the second switching material 110.

Figure 2A:
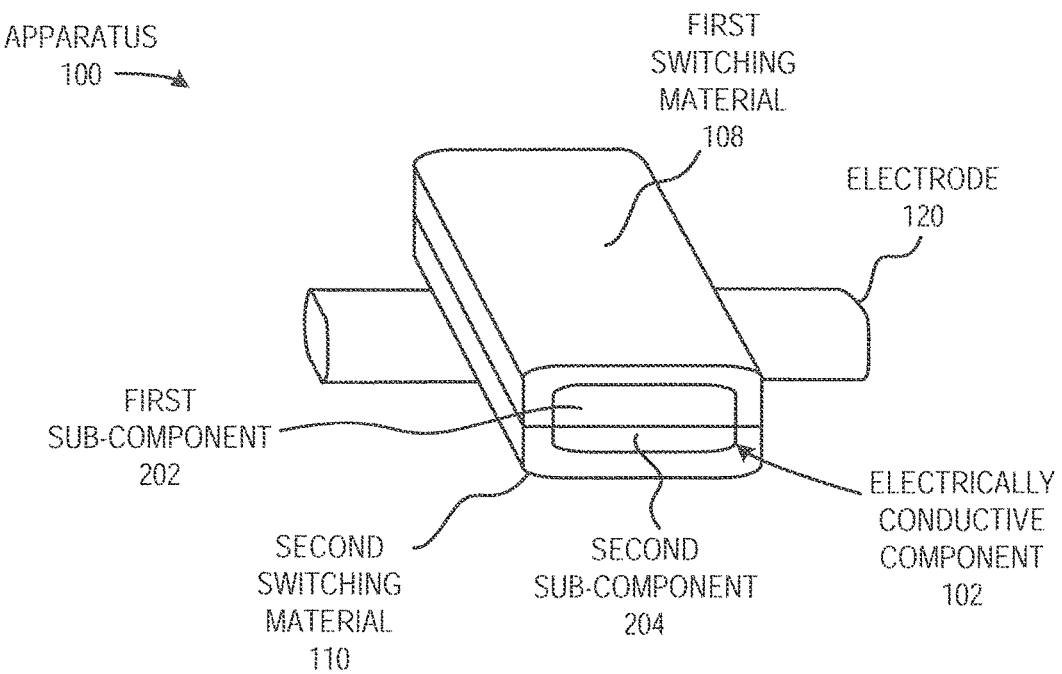

The apparatus 100 may generally be defined as an electrically actuated apparatus formed of the electrically conductive component 102, the first switching material 108, the second switching material 110, and the electrode 120. As shown, the electrode 120 is in contact with the first switching material 108, however, depending on the position at which contact is formed in the interweaving, the electrode 120 may alternatively be in contact with the second switching material 110 as shown in FIG. 2A. Thus, the electrode 120 may be in contact with one of the first switching material 108 and the second switching material 110, such that an electric field may be created in one of the first switching material 108 and the second switching material 110 through application of a voltage or current through either or both of the electrically conductive component 102 and the electrode 120.

According to an example, the electrically conductive component 102 may be formed of a different material than the electrode 120. By way of particular example, the electrically conductive component 102 may be formed of platinum, tantalum, or the like, and the electrode 120 may be formed of copper or the like. In other examples, the electrically conductive component 102 may be formed of an electrically conductive material, such as AlCu, AlCuSi, AlCuSi with a barrier layer, such as TiN, Cu, Ag, Ti, Ta, or the like.

The first switching material 108 and the second switching material 110 may be formed of different switching oxides, such as a metal oxides. Specific examples of switching oxide materials may include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, and gadolinium oxide, among other oxides. In addition to the binary oxides presented above, the switching oxides may be ternary and complex oxides such as silicon oxynitride. The oxides presented above may be formed using any of a number of different processes such as sputtering from an oxide target, reactive sputtering from a metal target, atomic layer deposition (ALD), evaporation from oxide sources, oxidizing a deposited metal or alloy layer, etc.

According to an example, the first switching material 108 and the second switching material 110 are formed of different switching materials such that, for instance, the first switching material 108 exhibits a different switching characteristic as compared to the second switching material 110. For instance, the first switching material 108 may have a higher threshold for changing its resistance level then the second switching material 110. In this regard, a lower strength electric field applied through the first switching material 108 and the second switching material 110 may result in the second switching material 110 changing its resistance state and the resistance state of the first switching material 108 remains unchanged. As another example, the polarity of a first switch formed with the first switching material 108 may be opposite the polarity of a second switch formed with the second switching material 110. This may happen, for instance, when the oxygen vacancy concentration at the interface of the electrically conductive component 102/first switching material 108 is much higher than the concentration at the interface of the electrically conductive component 102/second switching material 110.

The resistance levels or states of the first switching material 108 and the second switching material 110 may be changed in response to various programming conditions and the first switching material 108 and the second switching material 110 are able to exhibit a memory of past electrical conditions. For instance, the first switching material 108 and the second switching material 110 may be programmed to have one of a plurality of distinct resistance levels. Particularly, the resistance level of the first switching material 108 may be changed through application of a voltage or current, in which the voltage or current may cause mobile dopants in the first switching material 108 to move, which may alter the electrical operation of the first switching material 108. That is, for instance, the distinct resistance levels of the first switching material 108 may correspond to different current levels applied to the first switching material 108. By way of example, the first switching material 108 may be programmed to have a higher resistance level through application of a higher current level. The resistance level of the second switching material 110 may be changed through implementation of similar operations.

After removal of the current, the locations and characteristics of the dopants in the first switching material 108 and the second switching material 110 are to remain stable until the application of another programming electric field. That is, the first switching material 108 and the second switching material 110 are to remain at the programmed resistance level following removal of the current. The programmed resistance level may correspond to a value, such as the bit "1" or "0."

Turning now to FIG. 2A, the apparatus 100 is depicted as including all of the same features as those described above with respect to FIG. 1. However, the apparatus 100 depicted in FIG. 2A differs from the apparatus 100 depicted in FIG. 1 in that the electrode 120 is depicted as being in contact with the second switching material 110. In addition, the electrically conductive component 102 is depicted as being formed of a first sub-component 202 and a second sub-component 204. Particularly, the first switching material 108 is shown as being provided or formed on the first sub-component 202 and the second switching material 110 is shown as being provided or formed on the second sub-component 204.

According to an example, the first sub-component 202 may be formed of a material on which the first switching material 108 may grow, for example, TaOx growth from a Ta material, and the second sub-component 204 may be formed of the material on which the second switching material 110 may grow, for example, TiOx growth from a Ti material. Alternatively, an additional metal layer (not shown) may be provided on either or both the first sub-component 202 and the second sub-component 204, from which the first switching material 108 and/or the second switching material 110 may grow. By way of particular example, the materials for the first sub-component 202 and the second sub-component 204 may be selected to be materials that respectively facilitate the growth of the first switching material 108 and the second switching material 110 through a thermal oxidation process. For instance, the first sub-component 202 may be platinum (Pt), the second sub-component 204 may be tantalum (Ta), and the electrode 120 may be copper (Cu). In this example, the first sub-component 202 and the electrode 120 may undergo thermal oxidation to form a switching oxide (Ox) between the first sub-component 202 and the electrode 120. In addition, the second sub-component 204 and the electrode 120 may undergo thermal oxidation to form a switching oxide (Ox) between the second sub-component 204 and the electrode 120. The apparatus 100 may thus have a Pt/CuOx/Cu and a Ta/TaOx:CuOx/Cu configuration.

Figure 2B:
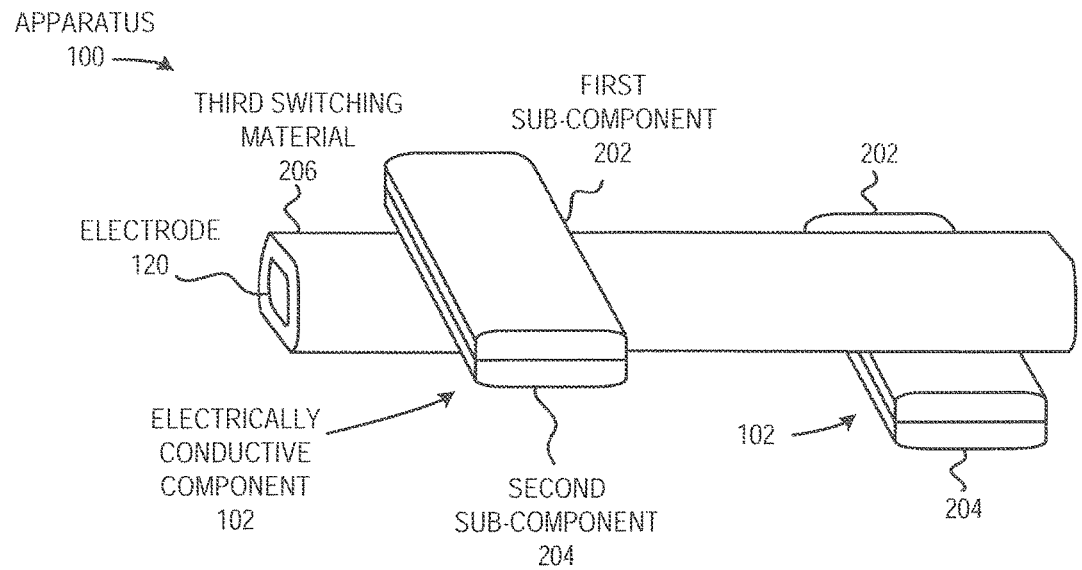
Figure 2C:
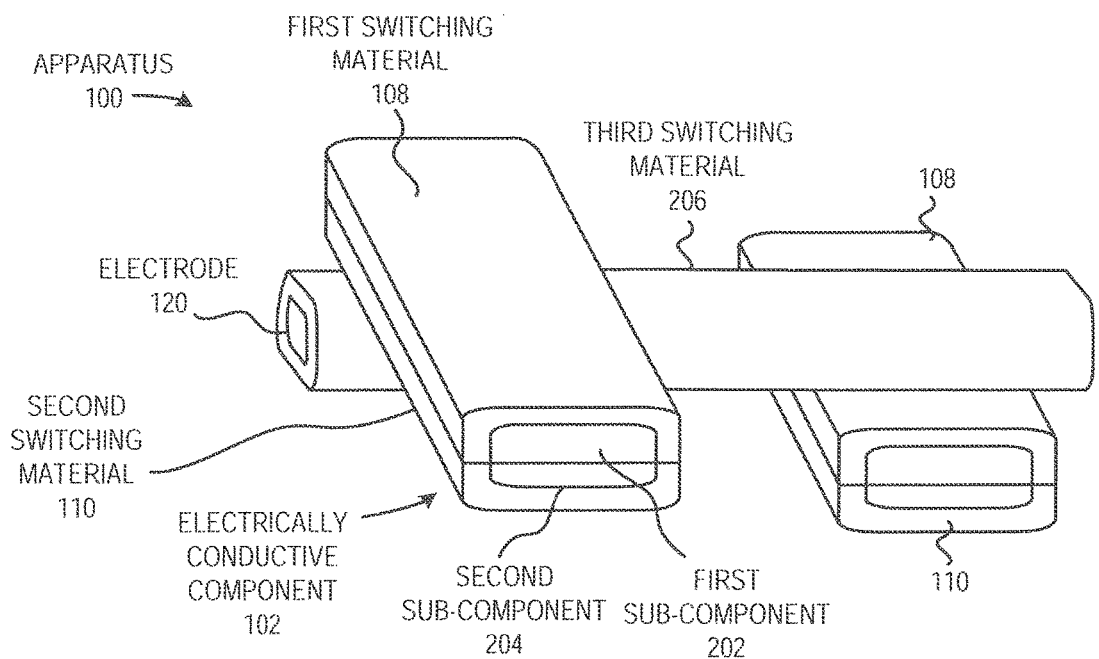

Turning now to FIGS. 2B and 2C, the apparatus 100 is depicted as including all of the same features as those described above with respect to FIGS. 1 and 2A. However, the apparatus 100 depicted in FIG. 2B differs from the apparatus 100 depicted in FIGS. 1 and 2A in that the electrically conductive component 102 is depicted as not having a switching layer formed on the electrically conductive component 102. Instead, as shown in FIG. 2B, a third switching material 206 is depicted as being formed on electrode 120. Additionally, FIG. 2B shows a portion of another electrically conductive component 102 in which the third switching material 206 is in contact with the first sub-component 202 of the electrically conductive component 102. In FIG. 2C, the electrically conductive component 102 is depicted as including the first switching material 108 and the second switching material 110 and the electrode 120 is depicted as including the third switching material 206. In addition, the third switching material 206 is depicted is alternatingly contacting the first switching material 108 and the second switching material 108. In both FIGS. 2B and 2C, it should be understood that the third switching material 206 may include any of the materials described above with respect to the first switching material 108 and the second switching material 110. FIGS. 2A-2C thus show that the apparatus 100 may include a single or dual oxide switching materials and that either or both of the electrically conductive component 102 and the electrode 120 may include switching materials formed thereon.

Figure 3:
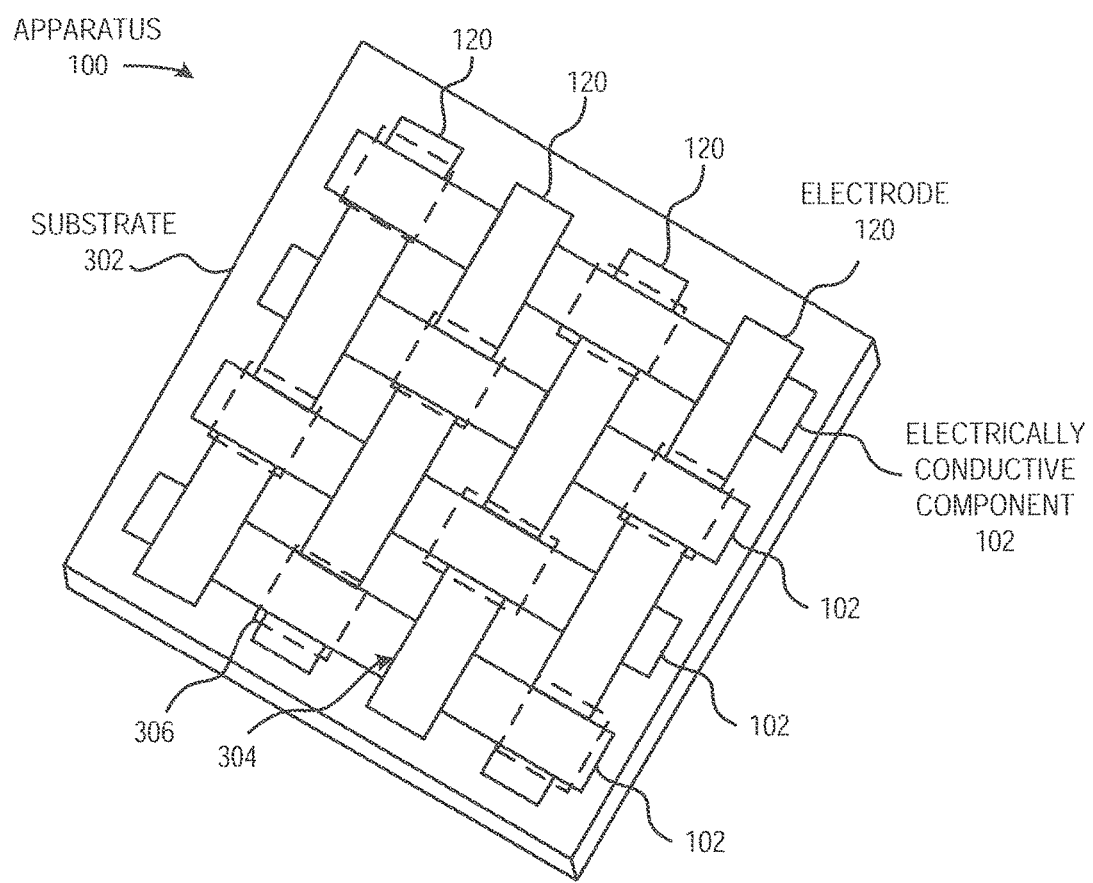
FIG. 3 shows a simplified isometric view of a portion of an apparatus, according to an example of the present disclosure.

With reference now to FIG. 3, there is shown a simplified isometric view of a portion of an apparatus 100, according to another example. It should be understood that the apparatus 100 depicted in FIG. 3 may include additional components and that some of the components described herein may be removed and/or modified without departing from a scope of the apparatus 100. In addition, although the components of the apparatus 100 have been depicted as having certain shapes and sizes, it should be clearly understood that the depictions of the components are for purposes of illustration only and that the components of the apparatus 100 may therefore have other shapes and sizes without departing from a scope of the apparatus 100. Moreover, it should be understood that the apparatus 100 may include any number of electrically conductive components 102 and electrodes 120 arranged in a crossbar configuration and that the electrically conductive components 102 and electrodes 120 may be configured in any of the manners depicted in FIGS. 1 and 2A-2C.

As shown in FIG. 3, the apparatus 100 includes a plurality of electrically conductive components 102 interweaved with a plurality of electrodes 120 in a crossbar array configuration. That is, each of the electrodes 120 is depicted as being interweaved with a number of electrically conductive components 102 such that an electrode 120 alternatingly contacts a top and a bottom of adjacent electrically conductive components 102.

In the example depicted in FIG. 1, each of the electrodes 120 alternatingly contacts the first switching material 108 and the second switching material 110 of the number of electrically conductive components 102. Reference numeral 304 indicates a junction at which an electrode 120 contacts the first switching material 108 of an electrically conductive component 102. Additionally, reference numeral 306, which refers to all of the dashed boxes shown in FIG. 3, indicates a junction at which an electrode 120 contacts the second switching material 110 of an electrically conductive component 102. The junctions 304 and 306 are the locations in the apparatus 100 at which the resistance states of the first switching material 108 and the second switching material 110 may be set and read.

As may be seen by the interweaved or interlaced structure of the array of electrically conductive components 102 and electrodes 120, each of the nearest junctions to any of the junctions 304 are the junctions 306. As such, junctions 304 having the same switching materials and thus the same characteristics as a particular junction 304 are located relatively farther away from the junction 304 than the junctions 306, which have different switching materials. In one regard, therefore, occurrences of sneak path currents through the crossbar array may be reduced as the characteristics of the switching materials in nearby junctions may be different from each other. In addition, the occurrences of sneak path currents may be reduced because the polarities of the first switching material 108 and the second switching material 110 may be opposite each other.

In other examples, the junctions 304 and 306 may have configurations as shown in FIGS. 2A-2C. In these examples, the junctions 304 and 306 may be formed to have a different characteristic with respect to each other through formation of the electrodes 120 and/or the electrically conductive components 102 in manners discussed above with respect to FIGS. 2A-2C.

The apparatus 100 is further depicted as including a substrate 302 upon which the crossbar array configuration of the electrically conductive components 102 and the electrodes 120 are positioned. According to an example, the array of electrically conductive components 102 and electrodes 120 may be attached to the substrate 302 such that the substrate 302 supports the array. In addition, the substrate 302 may be formed of a flexible material, such as a polymer, such that the array of electrically conductive components 102 and electrodes 120 may be flexed. In one regard, the combination of the substrate 302 and the interweaved configuration of the electrically conductive components 102 with the electrodes 120 may result in a relatively strong apparatus 100.

Although not shown, the apparatus 100 may include or may be connected to electronics that enable each of the junctions 304, 306 to be individually addressable, such as, a voltage source, a reader device, a controller, etc. In this regard, each of the electrically conductive components 102 and the electrodes 120 may be connected to a voltage source such that electric fields may be generated at the junctions 304 and 306.

Figure 4:
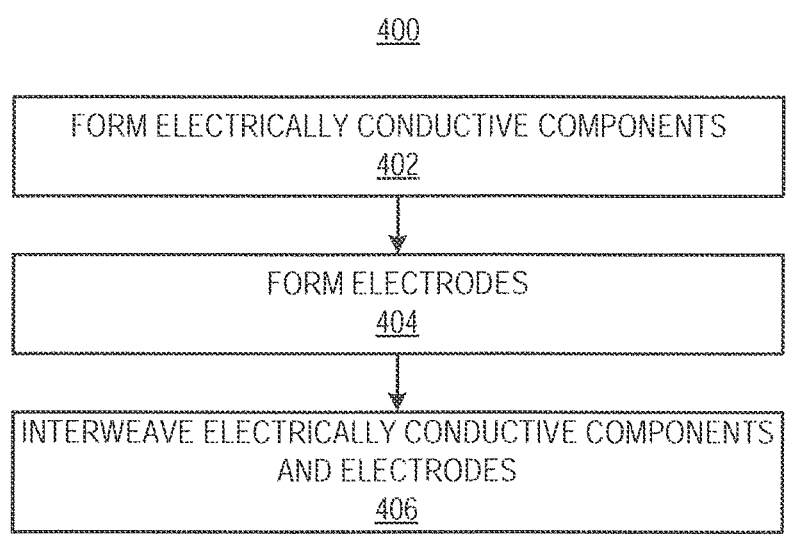
FIG. 4 shows a flow diagram of a method for fabricating an apparatus, according to an example of the present disclosure.

With reference now to FIG. 4, there is shown a flow diagram of a method for fabricating an apparatus 100, according to an example. It should be understood that the method 400 depicted in FIG. 4 may include additional operations and that some of the operations described herein may be removed and/or modified without departing from the scope of the method 400. The description of the method 400 is made with reference to the features depicted in FIGS. 1-3 for purposes of illustration and thus, it should be understood that the method 400 may be implemented in apparatuses having architectures different from those shown in those figures.

With reference to FIG. 4, at block 402, a plurality of electrically conductive components 102 may be formed. Particularly, for instance, each of the electrically conductive components 102 may be formed to have a respective first side 104 and second side 106. The electrically conductive components 102 may be formed through any suitable process such as sputtering, atomic layer deposition, formation of nanoparticle stripe patterns through dewetting, 3D printing, etc. In addition, the electrically conductive components 102 may be formed of a single structure as shown in FIG. 1 or may be formed to have a first sub-component 202 and a second sub-component 204 as shown in FIG. 2.

At block 404, the plurality of electrodes 120 may be formed. The electrodes 120 may be formed through any suitable fabrication process, such as sputtering, atomic layer deposition, formation of nanoparticle stripe patterns through dewetting, 3D printing, etc.

At block 406, the plurality of electrically conductive components 102 may be interweaved with the plurality of electrodes 120 such that the plurality of electrically conductive components 102 across the plurality of electrodes to form an array of junctions. Each of the plurality of electrodes 120 may be interwoven or interlaced with a number of the electrically conductive components 102 such that an electrode 120 alternatingly contacts the top and the bottom of adjacent electrically conductive components 102, as shown in FIG. 3. In addition, the interwoven or interlaced electrically conductive components 102 and electrodes 120 may be supported on a flexible substrate, for instance, the substrate 302 depicted in FIG. 3.

According to an example, the electrodes 120 may be interwoven with the electrically conductive components 102 following formation of the electrodes 120 and the electrically conductive components 102. In this example, the electrically conductive components 102 and the electrodes 120 may be formed of wires and may be woven together through a weaving process that is similar to weaving processes employed to weave other types of strands together. According to another example, the electrodes 120 may be interwoven with the electrically conductive components 102 during formation of the electrically conductive components 102, the electrodes 120, and a switching layer or layers. In this example, a three-dimensional (3-D) printer may be implemented to "print" the electrically conductive components 102 and the electrodes 120 into a crossbar arrangement, for instance, as shown in FIG. 3. In either of these examples, the switching layer or layers may be formed on either or both of the electrodes 120 and the electrically conductive components 102 through any of the processes described above, for instance, through a thermal oxidation process.

According to an example, forming of the plurality of electrically conductive components 102 and the plurality of electrodes 120 includes forming the plurality of conductive components 102 and the plurality of electrodes 120 to cause the junctions in the array of junctions to have a different characteristic than neighboring junctions. The junctions may be caused to have a different characteristic than neighboring junctions in any of the manners described above with respect to FIGS. 1 and 2A-2C.

In a first example corresponding to FIG. 1, a first layer 108 may be formed on the first side 104 of each of the electrically conductive components 102. As discussed above, the first layer 108 may be grown from the first switching material 108 or another metal material. The first layer 108 may also be formed through any suitable process including, chemical vapor deposition (CVD), physical vapor deposition (PVD), plasma-enhanced chemical vapor deposition (PECVD), atomic layer deposition (ALD), or the like. According to a particular example, the first layer 108 may be formed through thermal oxidation of the electrically conductive component 102 and the electrode 120. In another example, the first layer 108 may be formed through thermal oxidation of the first sub-component 202 of the electrically conductive component 102 and the electrode 120.

In addition, a second layer 110 may be formed on the second side 106 of the electrically conductive component 102. As discussed above, the second layer 110 may be formed of the second switching material 110. The second layer 110 may be formed through any suitable process including, CVD, PVD, PECVD, ALD, or the like. According to a particular example, the second layer 110 may be formed through thermal oxidation of the electrically conductive component 102. In another example, the second layer 110 may be formed through thermal oxidation of the second sub-component 204 of the electrically conductive component 102.

In a second example corresponding to FIG. 2A, the electrically conductive components 102 may each be formed of first and second sub-components 202, 204. In this example, the first layer 108 may be formed on the first sub-component 202 and the second layer 110 may be formed on the second sub-component 204 of each of the electrically conductive components 102. In addition, the electrodes 120 may alternatingly contact the first layer 108 and the second layer 110 of adjacent electrically conductive components 102 to form the junctions 304, 306.

In an example in which the first layer 108 and the second layer 110 are formed on the sub-components 202, 204 after the electrodes 120 are interwoven with the electrically conductive components 102, the first layer 108 may be formed on the first sub-component 202 through a thermal oxidation process of the first sub-component 202 and the electrode 120. Additionally, the second layer 110 may be formed on the second sub-component 204 through a thermal oxidation process of the second sub-component 204 and the electrode 120. As described above, because the first sub-component 202 and the second sub-component 204 are different materials, thermal oxidation of the first sub-component 202 and the second sub-component 204 are to result in switching materials, e.g., oxides, having different characteristics with respect to each other. According to an example, a thermal oxidation process may be performed concurrently on the first and second sub-components 202, 204.

In a third example corresponding to FIG. 2B, the electrically conductive components 102 may each be formed of first and second sub-components 202, 204 and switching materials 206 may be formed on the electrodes 120. In this example, the switching materials 206 may alternatingly contact the first sub-component 202 and the second sub-component 204 of adjacent electrically conductive components 102 to form the junctions 304, 306.

In a fourth example corresponding to FIG. 2C, the electrically conductive components 102 may each be formed of first and second sub-components 202, 204 and switching materials 108, 110, and 206 may be formed on the first sub-component 202, the second sub-component 204, and the electrodes 120, respectively. In this example, the switching materials 206 may alternatingly contact the first switching material (layer) 108 and the second switching material (layer) 110 of adjacent electrically conductive components 102 to form the junctions 304, 306.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein are examples of the disclosure along with some variations. The terms, descriptions and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

What is claimed is:

1. An apparatus comprising:
a plurality of electrically conductive components each having a first side and a second side;
a first switching material formed on the first side of the electrically conductive components;
a second switching material formed on the second side of the electrically conductive components, wherein the second switching material includes a different material than the first switching material, and wherein resistance states of each of the first switching material and the second switching material are to be modified through application of electric fields through the first switching material and the second switching material; and
an electrode interweaved between a single level of the plurality of electrically conductive components formed on a substrate such that the electrode alternatingly contacts the first switching material and the second switching material of the plurality of electrically conductive components.

2. The apparatus according to claim 1, wherein the electrically conductive component is formed of a first electrically conductive sub-component and a second electrically conductive sub-component and wherein the first electrically conductive sub-component is formed of a different material than the second electrically conductive sub-component.

3. The apparatus according to claim 2, wherein the first switching material is formed on the first electrically conductive sub-component and the second switching material is formed on the second electrically conductive sub-component.

4. The apparatus according to claim 3, wherein the first electrically conductive sub-component is formed of a material from which the first switching material is to grow and the second electrically conductive sub-component is formed of a material from which the second switching material is to grow.

5. The apparatus according to claim 4, wherein the first switching material and the second switching material are to respectively grow through implementation of thermal oxidation processes on the first electrically conductive sub-component and the second electrically conductive sub-component.

6. The apparatus according to claim 1, further comprising:
a flexible substrate, wherein the electrically conductive component and the electrode are positioned on the flexible substrate.

7. The apparatus according to claim 1, further comprising:
a plurality of the electrodes, wherein the electrodes are interweaved with the electrically conductive components such that each of the electrodes alternatingly contacts the first switching material and the second switching material of a number of the electrically conductive components.

8. The apparatus according to claim 1, wherein the second switching material has a different electrical polarity than the first switching material.

9. An apparatus comprising:
an electrically conductive component formed of a first electrically conductive sub-component and a second electrically conductive sub-component, wherein the first electrically conductive sub-component is formed of a different material than the second electrically conductive sub-component, and wherein the first electrically conductive sub-component is collinear with and contacts the second electrically conductive sub-component along a length of the first electrically conductive sub-component;
an electrode extending in a transverse direction with respect to the electrically conductive component; and
a first switching material formed collinear with and along a length on the electrode and the first switching material in contact with the electrically conductive component, and wherein:
a resistance state of the first switching material is to be modified through application of an electric field through the first switching material; and
a property of a first switch formed from the first switching material between the electrode and the first electrically conductive sub-component differs from a property of a second switch formed from the first switching material between the electrode and the second electrically conductive sub-component.

10. The apparatus according to claim 9, wherein the electrically conductive component further includes:
   a second switching material formed on the first electrically conductive sub-component; and
   a third switching material formed on the second electrically conductive sub-component, wherein the first switching material is in contact with one of the second switching material and the third switching material.

* * * * *